United States Patent [19]
Holtvoeth et al.

[11] Patent Number: 5,619,152
[45] Date of Patent: Apr. 8, 1997

[54] CIRCUIT ARRANGEMENT FOR SUPPLYING AN ALTERNATING SIGNAL CURRENT

[75] Inventors: Knud Holtvoeth; Andreas Wichern, both of Hamburg, Germany

[73] Assignee: U.S. Philips Corporation, New York, N.Y.

[21] Appl. No.: 404,078

[22] Filed: Mar. 14, 1995

[30] Foreign Application Priority Data

Mar. 26, 1994 [DE] Germany ............... 44 10 560.6

[51] Int. Cl.$^6$ ................................................ H03K 3/00
[52] U.S. Cl. ....................... 327/110; 327/382; 330/292
[58] Field of Search ............................ 327/110, 362, 327/378, 382; 330/288, 292

[56] References Cited

U.S. PATENT DOCUMENTS

| | | | |
|---|---|---|---|
| 3,810,256 | 5/1974 | Van Doorn ............................. | 330/28 |
| 4,764,736 | 8/1988 | Usui et al. ............................. | 330/294 |
| 5,028,811 | 7/1991 | Le Roux et al. ...................... | 327/110 |
| 5,424,665 | 6/1995 | Sueri et al. ............................ | 327/378 |

FOREIGN PATENT DOCUMENTS

| | | |
|---|---|---|
| 0264631 | 9/1987 | European Pat. Off. . |
| 3590480 | 9/1985 | Germany . |

OTHER PUBLICATIONS

IEEE Journal of Solid-State Circuits, Bd. 26, No. 10, Oct. 1991 New York Seiten 1457–1460, H. Parzhuber et al 'An Adaptive Biasing One-Stage CMOS Operational Amplifier for Driving High Capacitive Loads'.

Revue De Physique Appliquee, Bd. 20, No. 7, Jul. 1985 Paris, Fr, Seiten 465–482, F. Baillieu et al, 'L'Amplificateur CMOS Dans Les Circuits A Capacites Commutees'.

*Primary Examiner*—Timothy P. Callahan
*Assistant Examiner*—Jung Ho Kim
*Attorney, Agent, or Firm*—Bernard Franzblau

[57] ABSTRACT

A high frequency amplifier circuit arrangement has an output current path having one end coupled to a reference potential for supplying an alternating signal current at an output terminal. The influence of parasitic inductances in the output current path on the amplitude of the alternating signal current is reduced or cancelled in that compensation is provided for the influence of a parasitic inductance in the coupling between the output current path and the reference potential by means of a compensation circuit which applies an alternating compensation current to a (first) node between the output current path and the parasitic inductance. This compensation current is in phase opposition to and of at least substantially the same magnitude as the alternating signal current.

14 Claims, 1 Drawing Sheet

CIRCUIT ARRANGEMENT FOR SUPPLYING AN ALTERNATING SIGNAL CURRENT

BACKGROUND OF THE INVENTION

This invention relates to a circuit arrangement comprising an output current path, having one end coupled to a reference potential, for supplying an alternating signal current.

The publication DE 35 90 480 T1 which corresponds to U.S. Pat. No. 4,764,736 Aug. 16,1988, describes an amplifier for a high-frequency signal which is constructed as an integrated circuit comprising at least two stages of d.c. coupled grounded-emitter amplifiers. An emitter resistor is arranged between an emitter of the grounded-emitter amplifier in a second or subsequent stage and ground. A connection external to the integrated circuit is connected to the emitter of the commonemitter amplifier in the second or subsequent stage via a connecting lead. A filter circuit arranged between said connection and the external ground comprises an inductance of the connecting lead and has a low impedance for a given frequency. This is in order to provide a high-frequency amplifier capable of stable operation without any transient phenomena being produced. However, owing to the presence of the filter circuit this known amplifier is only suitable for use with very narrow bandwidths.

U.S. Pat. No. 3,810,256 describes a wide-band transistor amplifier comprising a feedback circuit for maximal negative feedback and a switching circuit, by means of which as a kind of negative feedback only the noise components occurring in the output signal of the amplifier are fed back in order to provide an additional reduction. To this end the transistor amplifier comprises a cascade arrangement of two impedances whose node is connected to the input of a phase inverter, which feeds the phase-inverted noise components into the output circuit of the amplifier. In this circuit arrangement the emitter connection of an amplifier stage also includes a damped parallel resonant circuit for influencing the high-frequency gain. However, this neither provides wide-band operation.

EP-A-264,631 describes a frequency-compensated feedback transistor amplifier having a comparatively large bandwidth and comparatively wide phase and gain limits independently of the intrinsic transconductance of the transistors in the amplifier. The known arrangement comprises a transconductance amplifier and an amplifier stage. The transconductance amplifier supplies an input signal to the amplifier stage and the amplifier stage produces an amplified replica of this input signal. A feedback capacitor is arranged between the output and the input of the amplifier stage and reduces the loop gain by 6 dB per octave with increasing frequency. The capacitor forms a signal path for residual components of the input signal in a manner such that these residual components appear on the amplifier output substantially in phase with the IF output signal.

In circuit arrangements of the type defined in the opening paragraph it appears that for alternating signal currents of comparatively high frequency the amplitude of the alternating signals currents to be produced is distinctly affected by parasitic impedances. Particularly if such a circuit arrangement comprises a current path having one end coupled to a reference potential, for example, ground, even a short connecting lead between the output current path and the reference potential will form a parasitic inductance across which a substantial voltage appears at higher frequencies, which voltage provides a negative feedback by means of which the amplitude of the alternating signal current can be reduced appreciably.

SUMMARY OF THE INVENTION

It is an object of the invention to construct a circuit arrangement of the type defined in the opening paragraph in a manner such that parasitic inductances in the output current path do not affect the amplitude of the alternating signal current.

According to the invention this object is achieved with a circuit arrangement of the type defined in the opening paragraph in that, in order to compensate for the influence of a parasitic inductance in the coupling between the output current path and the reference potential, there is provided a compensation circuit by means of which an alternating compensation current can be applied to a (first) node between the output current path and the parasitic inductance, which compensation current is in phase opposition to and of at least substantially the same magnitude as the alternating signal current.

As already stated, a parasitic inductance in the output current path, particularly in a coupling of this path to a reference potential, produces an effective negative feedback at high frequencies which attenuates the alternating signal current to a strongly increasing extent as the frequency increases. Steps are known to minimise such parasitic inductances but this often leads to an intricate circuit arrangement, which is generally not very effective. If the circuit arrangement for supplying the alternating signal current takes the form of an integrated circuit on a semiconductor body noticeable parasitic inductances arise already as a result of the contact lead from the semiconductor body to the reference potential, for example, ground, available outside the integrated circuit. The parasitic inductances of these leads can be reduced only to a limited extent and in an intricate manner, for example, by the parallel arrangement of a very large number of bonding wires between the semiconductor body and a solder terminal or a conductor track. However, such parallel bonding wires are difficult to fabricate and require much room, which is no longer economically justified in view of the magnitude of the actual alternating signal currents to be supplied.

The invention solves this problem in that the currents in the parasitic inductance which produce a negative feedback voltage are at least partly combined with and neutralised by an alternating compensation current. Preferably, this alternating compensation current is derived in phase opposition from the same currents or voltages inside the circuit arrangement from which the alternating signal current to be supplied by the circuit arrangement is also derived. This ensures in particular a simple wide-band compensation for the undesired negative feedback caused by the parasitic inductance. This improves the transmission characteristic of the circuit arrangement over a large frequency range. No intricate constructions are needed for coupling the output current path to the reference potential.

Preferably, the output current path of the circuit arrangement in accordance with the invention comprises a main current path of a (first) output transistor. This transistor forms the output stage of the circuit arrangement for supplying the alternating signal current and may be, in particular, a bipolar transistor in grounded-emitter connection. The parasitic inductance neutralised by the invention is then situated in the coupling between the emitter of this (first) output transistor and a conductor carrying the reference potential, for example, ground.

In a further embodiment the compensation circuit comprises a (second) output transistor having one end of its main current path connected to the first node and having its second end connected to a control terminal of the (first) output transistor. Thus, the first and the second output transistor can teed currents into the parasitic inductance via their main current paths. Preferably, the first and the second output transistor are arranged to receive a.c. control signals of opposite phase. When the output transistors are thus driven the drive of the first output transistor at its control terminal is amplified by the second output transistor, which is driven in phase opposition, whereas at the same time alternating current components which are in phase opposition and thus compensate for one another are fed into the parasitic inductance by the output transistors. The voltage components at the frequency of the alternating signal current which appear across this parasitic inductance are thus reduced or eliminated. This cancels the negative feedback effect.

It is advantageous to derive the anti-phase a.c. control signals, which can be applied to the first and the second output transistor, from opposite-phase outputs of a common signal source. Such a signal source may be, for example, a differential amplifier having an inverting and a non-inverting output. The required opposite-phase a.c. control signals are available on the outputs of the differential amplifier without any additional circuit elements.

In another embodiment the circuit arrangement in accordance with the invention is constructed in a manner such that the first output transistor functions as the output branch of a first current mirror circuit, which further comprises

- a first input transistor whose control terminal is connected to the control terminal of the first output transistor and whose main current path has one end connected to the first node,
- a first direct current source between the control terminal of the first output transistor and the first node,
- a second direct current source for supplying a (second) direct current into the main current path of the first input transistor via second node, and
- a first driver transistor whose main current path has one end connected to the control terminal of the first output transistor and whose control terminal, which is connected to the second node, is arranged to receive one of the a.c. control signals, and in that the second output transistor functions as the output branch of a second current mirror circuit whose construction corresponds to that of the first current mirror circuit. A control terminal of a second driver transistor, which corresponds to the first driver transistor, is arranged to receive the second one (of opposite phase) of the a.c. control signals.

In this embodiment the compensation circuit is formed by the second current mirror circuit. By means of its (second) output transistor this current mirror circuit supplies an alternating compensation current to the parasitic inductance and also drives the (first) output transistor of the first current mirror circuit. The identical construction of the two current mirror circuits then provides a drive with opposite-phase a.c. control signals of equal amplitude without any further measures being required.

BRIEF DESCRIPTION OF THE DRAWINGS

An exemplary embodiment of the invention will now be described in more detail with reference to the drawing. In the drawing.

DESCRIPTION OF THE PREFERRED EMBODIMENTS

Figure 1:
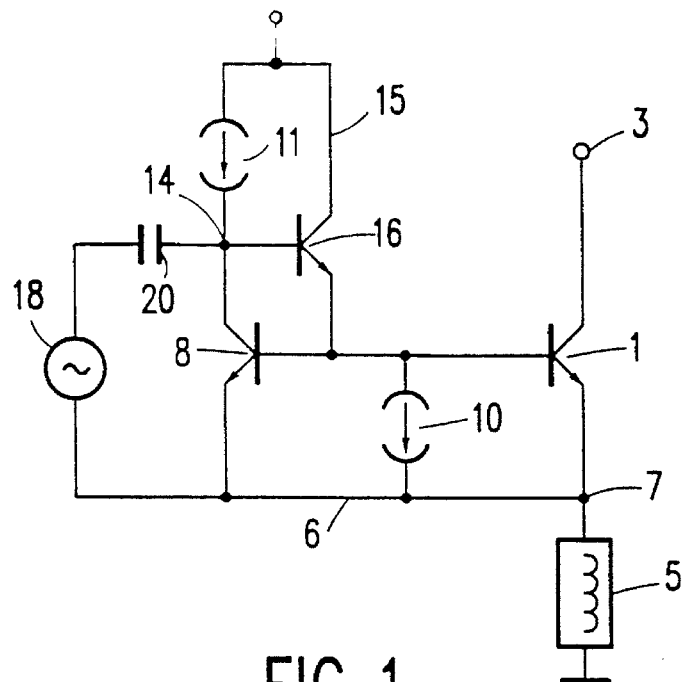
FIG. 1 shows an example of a circuit arrangement of the type defined in the opening paragraph for supplying an alternating signal current without a compensation circuit.

In FIG. 1 a first output transistor 1 is constructed as a bipolar transistor whose main current path between its collector and emitter terminals forms part of an output current path between an output terminal 3 and a line at a reference potential, for example, ground 4. An alternating signal current is available at the output terminal 3 of the circuit arrangement shown in FIG. 1.

The output current path via the main current path of the first output transistor 1 is coupled to ground 4 via a parasitic inductance 5. The parasitic inductance 5 is formed by a lead between ground 4 and an internal bus 6, which is formed by, for example, a ground connection in a circuit which is integrated on a semiconductor body. The parasitic inductance 5 is then formed by a connection of the internal bus 6 on the semiconductor body to the line 4 outside the integrated circuit, which line 4 is at ground potential, for example, the apparatus ground. The value of the parasitic inductance 5 may be dictated by the internal leads on the semiconductor body, by bonding wires from the semiconductor body to the external connection of the integrated circuit, or even-by external conductors. The microcomputer of the first output transistor 1 is connected to the parasitic inductance 5 at a first node 7 via the emitter terminal of this transistor.

In the example shown in FIG. 1 the first output transistor 1 functions as an output branch of a first current mirror circuit, which further comprises a first input transistor 8, which is also a bipolar transistor and whose control terminal, i.e. its base terminal, is connected to the control terminal (base terminal) of the first output transistor. The first input transistor 8 has one end of its main current path connected to the first node 7 via its emitter terminal. A first direct current source 10 is arranged between, on the one hand, the connection between the control terminals of the first output transistor 1 and the first input transistor 8 and, on the other hand, the first node 7 or the internal bus 6. A second direct current source 11 for feeding a second direct current into the main current path of the first transistor 8 via a second node 14 has one side connected to the collector terminal of this first input transistor 8, which collector terminal forms the second node 14, and has its other side connected to a supply voltage connection 15. The first and the second direct current source 10, 11 serve for setting the operating point of the first current mirror circuit.

The first current mirror circuit further comprises a first driver transistor 16, which in the example shown in FIG. 1 is also formed by a bipolar transistor and whose main current path has one end connected to the control terminal of the first output transistor 1 (via the emitter terminal of the first driver transistor 16) and has its other end connected to the supply voltage connection 15 (via the collector terminal of the first driver transistor 16). The control terminal (in the present case the base terminal) of the first driver transistor 16 is connected to the second node 14. The base currents of the first output transistor 1 and of the first input transistor 8 as well as the direct current of the first direct current source 10 are applied from the supply voltage connection 15 via the main current path of the first driver transistor 16.

A first a.c. control signal can be applied to the first driver transistor 16 via the second node 14. This signal is supplied by a first a.c. control signal source 18 and is applied to the second node 14 via a first coupling capacitor 20. The first a.c. control signal controls the first output transistor 1 and hence the alternating signal current at the output terminal 3 via the first driver transistor 16, which operates as an emitter follower. The other circuit elements except for the parasitic inductance 5 primarily influence only the d.c. setting and may therefore be ignored in the description of the a.c. behaviour of the circuit arrangement. The alternating signal current at the output terminal 3, which flows through the main current path of the first output transistor 1 and the parasitic inductance 5, produces a voltage across the parasitic inductance 5, as a result of which the first a.c. control signal or the resulting alternating voltage at the control input of the first output transistor 1 experiences an effective negative feedback, particularly at high frequencies. This results in a substantial reduction of the amplitude of the a.c. control signal at the output terminal 3.

During a test the parasitic inductance 5 of a lead of a circuit integrated on a semiconductor body had a value of 2 nH. This inductance value provides, for example, a reactance of 11.5 ohms at a frequency of 915 MHz.

Figure 2:
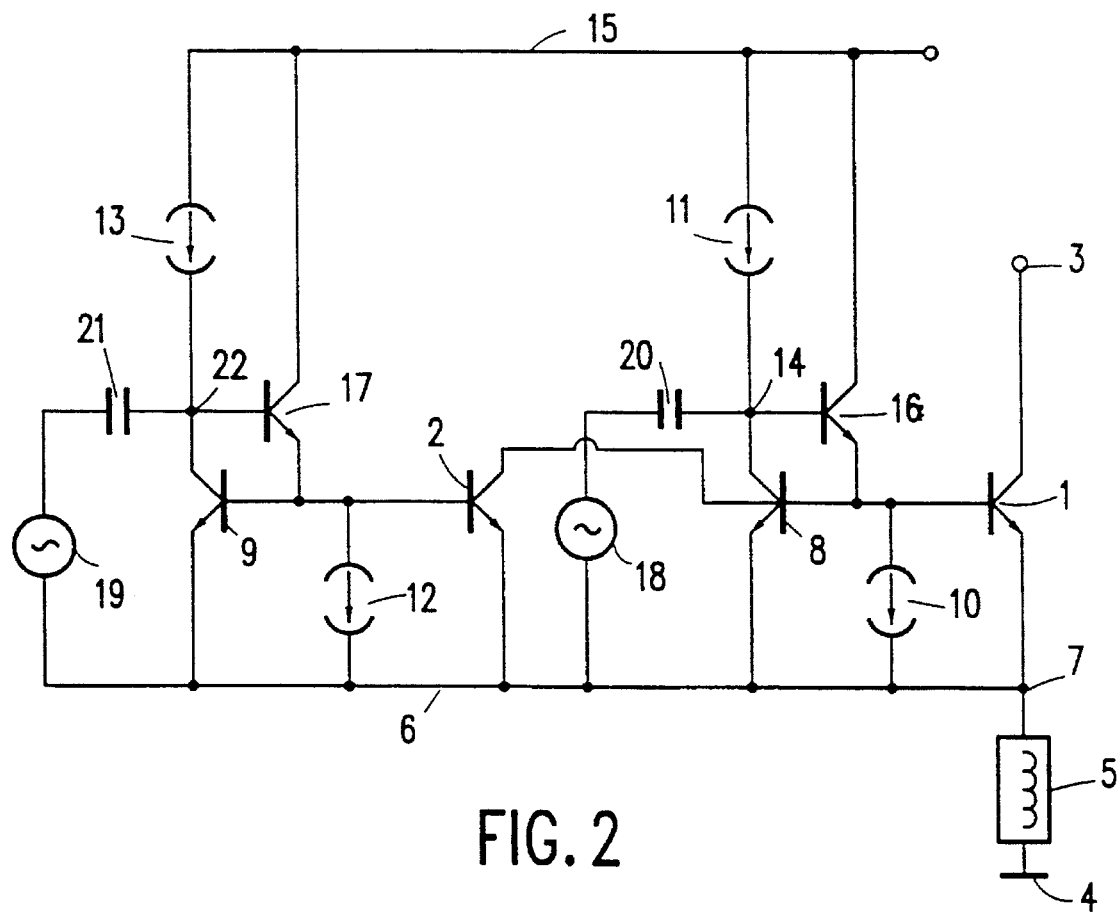
FIG. 2 shows the circuit arrangement of FIG. 1 with an additional compensation circuit.

FIG. 2 shows an embodiment of a high frequency wide band amplifier circuit arrangement in accordance with the invention in which the influence of the parasitic inductance 5 is compensated by the addition of a compensation circuit to the elements in FIG. 1. In addition to the similarly referenced elements already described with reference to FIG. 1, the circuit arrangement shown in FIG. 2 has in its compensation circuit a second current mirror circuit, which comprises a second output transistor 2 and a second input transistor 9. The main current path of the second output transistor 2 forms the output branch of this second current mirror circuit. The control terminals of the second output transistor 2 and of the second input transistor 9 are connected to one another and to a terminal of a third direct current source 12 and to the emitter terminal of a second driver transistor 17. The emitter terminals of the transistors 2, 9 of the second current mirror circuit, which transistors also take the form of bipolar transistors and whose dimensioning corresponds to that of the first output transistor 1 and the second input transistor 8, respectively, are connected to the first node 7 by the internal bus 6, which first node is also coupled to a second terminal of the third current source 12. The collector terminal of the second driver transistor 17 and one terminal of a fourth direct current source 13 are connected to the supply voltage connection 15. A second terminal of the fourth direct current source 13 is connected to a third node 22 between the collector terminal of the second input transistor 9, a control terminal of the second driver transistor 17 and one terminal of a second coupling capacitor 21. A second a.c. control signal, which preferably corresponds in frequency and amplitude to the first a.c. control signal but is in phase opposition thereto, is applied to the third node 22 via said second coupling capacitor, which is also connected to a second a.c. control signal source 19. Preferably, the a.c. control signal sources 18, 19 may be opposite-phase outputs (inverting and non-inverting) of an operational amplifier or the like, which for simplicity is not shown in FIG. 2. The AC signal 18 is applied to the base of transistor 1 via a circuit path that is exclusive of the second output transistor 2. The second output transistor 2 has its main current path, which forms the output branch of the second current mirror circuit, connected to the control terminal of the first output transistor 1 via the collector terminal of this second output transistor.

In the circuit arrangement shown in FIG. 2, as compared with the circuit arrangement in FIG. 1, a substantial part of the quiescent current, i.e. of the direct current flowing through the main current path of the first driver transistor 16 for setting the operating point of the first current mirror circuit, no longer flows through the first direct current source 10 but through the second output transistor 2. In this second output transistor 2 this part of the quiescent current of the first driver transistor 16 is used to improve the swing of the first driver transistor 1. As a result of this, a very small additional current is withdrawn from the supply voltage connection 15.

In the second output transistor 2 the part of the quiescent current of the first driver transistor 16 fed into the main current path of the second output transistor 2 is controlled by the second a.c. control signal source 19 in phase opposition to the first output transistor 1. Since also in the second current mirror circuit only the (second) output transistor is of importance for the a.c. behaviour, the a.c. behaviour of the entire circuit arrangement shown in FIG. 2 can be explained on the basis of a simplified circuit comprising only the two output transistors 1, 2 and the parasitic inductance 5. Such a simplified a.c. circuit shows that by an opposite-phase drive at the control terminals of the output transistors 1, 2 the drive at the control terminal of the first output transistor 1 and hence the alternating signal current at the output terminal 3 can be increased and, in addition, currents of opposite phase can now be applied to the parasitic inductance 5 via the emitter terminals of the output transistors 1 and 2, where the currents cancel one another at least partly. As a result, the voltage across the parasitic inductance 5 which causes the negative feedback is also eliminated at least partly, so that the alternating signal current at the output terminal 3 is no longer damped.

In a practical embodiment the compensation circuit thus enabled the magnitude of the alternating signal current at the output terminal 3 to be substantially quadrupled for a given signal frequency with only an insignificant increase in current consumption. Conversely, the required driving power and hence the overall power consumption and heat dissipation of the circuit arrangement can be reduced for a given amplitude of alternating signal current, without a more intricate construction being needed for the connections of the circuit arrangement to external conductor configurations.

We claim:

1. A circuit arrangement comprising: an output current path having one end coupled to a reference potential and another end coupled to an output for supplying an alternating signal current, wherein a parasitic inductance is present in a coupling between the output current path and the reference potential, and a compensation circuit for applying an alternating compensation current to a first node between the output current path and the parasitic inductance, which compensation current is in phase opposition to and of a magnitude at least substantially the same as that of the alternating signal current so as to compensate for the influence of the parasitic inductance.

2. A circuit arrangement as claimed in claim 1, wherein the output current path comprises a main current path of a first output transistor.

3. A circuit arrangement as claimed in claim 2, wherein the first output transistor is a bipolar transistor connected as an emitter follower.

4. A circuit arrangement as claimed in claim 3, wherein the compensation circuit comprises a second output transistor having one end of its main current path connected to the first node and having its second end connected to a control terminal of the first output transistor.

5. A circuit arrangement as claimed in claim 4, wherein the first and the second output transisters are arranged to receive a.c. control signals of opposite phase.

6. A circuit arrangement as claimed in claim 5, wherein the a.c. control signals of opposite phase are received from first and second outputs of a common signal source, which outputs carry signals of opposite phase.

7. A circuit arrangement as claimed in claim 5, wherein the first output transistor comprises an output branch of a first current mirror circuit which further comprises

- a first input transistor having a control terminal connected to the control terminal of the first output transistor and a main current path with a first end connected to the first node,
- a first direct current source coupled between the control terminal of the first output transistor and the first node,
- a second direct current source for supplying a direct current into the main current path of the first input transistor via a second node coupled to a second end of the first input transistor, and
- a first driver transistor having a main current path with one end connected to the control terminal of the first output transistor and a control terminal connected to the second node which is arranged to receive one of the a.c. control signals,
- wherein the second output transistor functions as an output branch of a second current mirror circuit which corresponds to the first current mirror circuit, and
- means for supplying a control terminal of a second driver transistor with a second one (of opposite phase) of the a.c. control signals.

8. A circuit arrangement as claimed in claim 1, characterised by full integration on a semiconductor body, the parasitic inductance comprising a lead between the semiconductor body and a given conductor configuration which is external to said semiconductor body and which carries the reference potential.

9. A high frequency wide band amplifier comprising:

- an output terminal for supplying an alternating current signal to a load device,
- a circuit point providing a reference potential,
- an output current path including a main current path of a first output transistor coupled between said output terminal and said circuit point of reference potential and having a parasitic inductance in a coupling between the main current path of the output transistor and the circuit point of reference potential,
- a first circuit path for supplying an AC signal to be amplified to a control terminal of said first output transistor, and
- a compensation circuit for compensating a negative feedback produced by a current flow in said parasitic inductance, said compensation circuit supplying a compensation current to a first circuit node between the main current path of the output transistor and the parasitic inductance and which is in phase opposition to and of a magnitude substantially the same as that of the alternating current signal and via a second circuit path independent of the first circuit path.

10. The high frequency wide band amplifier as claimed in claim 9, wherein the compensation circuit comprises a second output transistor having a main current path coupled between said first circuit node and the control terminal of the first output transistor.

11. The high frequency wide band amplifier as claimed in claim 10, wherein said AC signal is supplied to the control terminal of the first output transistor via the first circuit path, said first circuit path being exclusive of the second output transistor.

12. The high frequency wide band amplifier as claimed in claim 10 further comprising means for supplying to a control terminal of the second output transistor a further AC signal of opposite phase to said AC signal, and wherein said first circuit path is independent of the second output transistor.

13. The high frequency wide band amplifier as claimed in claim 10, wherein said first output transistor comprises an output branch of a first current mirror having an input branch including a first input transistor having a control terminal connected to the control terminal of the first output transistor and a main current path connected between the first circuit node and a terminal of a source of DC voltage.

14. The high frequency wide band amplifier as claimed in claim 13, wherein said second output transistor comprises an output branch of a second current mirror having an input branch including a second input transistor having a control terminal connected to the control terminal of the second output transistor and a main current path connected between the first circuit node and a terminal of a source of DC voltage.

\* \* \* \* \*